(12) United States Patent
Ghosh Dastidar

(10) Patent No.: US 7,424,658 B1
(45) Date of Patent: Sep. 9, 2008

(54) METHOD AND APPARATUS FOR TESTING INTEGRATED CIRCUITS

(75) Inventor: Jayabrata Ghosh Dastidar, Santa Clara, CA (US)

(73) Assignee: Altera Corporation, San Jose, CA (US)

( * ) Notice: Subject to any disclaimer, the term of this patent is extended or adjusted under 35 U.S.C. 154(b) by 440 days.

(21) Appl. No.: 10/188,162

(22) Filed: Jul. 1, 2002

(51) Int. Cl.
*G01R 31/28* (2006.01)

(52) U.S. Cl. .................................................. 714/738

(58) Field of Classification Search ................. 714/724, 714/725, 726, 727, 729, 738, 733, 736; 326/40, 326/41, 38, 39
See application file for complete search history.

(56) References Cited

U.S. PATENT DOCUMENTS

| | | | |
|---|---|---|---|
| 4,488,259 A | | 12/1984 | Mercy |
| 4,617,479 A | | 10/1986 | Hartmann et al. |
| 4,710,927 A | | 12/1987 | Miller |
| 4,871,930 A | | 10/1989 | Wong et al. |
| 5,128,944 A | * | 7/1992 | Flaherty et al. ................ 714/6 |
| 5,241,224 A | | 8/1993 | Pedersen et al. |
| 5,258,668 A | | 11/1993 | Cliff et al. |
| 5,260,610 A | | 11/1993 | Pedersen et al. |
| 5,260,611 A | | 11/1993 | Cliff et al. |
| 5,412,260 A | | 5/1995 | Tsui et al. |
| 5,436,575 A | | 7/1995 | Pedersen et al. |
| 5,550,782 A | | 8/1996 | Cliff et al. |
| 5,790,479 A | | 8/1998 | Conn |
| 5,991,898 A | | 11/1999 | Rajski et al. |
| 6,021,513 A | * | 2/2000 | Beebe et al. ................ 714/726 |
| 6,097,211 A | | 8/2000 | Couts-Martin et al. |
| 6,233,205 B1 | | 5/2001 | Wells et al. |
| 6,457,145 B1 | * | 9/2002 | Holmberg et al. ............. 714/45 |
| 6,557,129 B1 | * | 4/2003 | Rajski et al. ................ 714/729 |
| 6,646,464 B2 | * | 11/2003 | Maruyama ................... 326/35 |
| 2003/0056170 A1 | * | 3/2003 | Majumdar ................... 714/820 |
| 2003/0079165 A1 | * | 4/2003 | Ffrench et al. .............. 714/726 |

OTHER PUBLICATIONS

"AT94K Series Field Programmable System Level Intergrated Circuit," Advance Information Brochure of Atmel Corporation, Dec. 1999, 6 pages.

"CS2000 Reconfigurable Communications Procssor Family Product Brief, " Advance Product Information from ChameleonSystems, Inc., 2000, pp. 1-8.

(Continued)

*Primary Examiner*—James C Kerveros
(74) *Attorney, Agent, or Firm*—Townsend and Townsend and Crew LLP

(57) ABSTRACT

A technique and device for testing integrated circuits is implemented by comparing similar test outputs for differences. One particular type of integrated circuit that may benefit from this method of testing is a programmable logic integrated circuit. Separate logic units in the integrated circuit receive test patterns and generate outputs based on the test patterns. A comparator is then used to compare the outputs. If one output differs from the other outputs, an error message is created and test result information is stored in memory for use in pinpointing the cause of the error signal. In other embodiments, a microprocessor or embedded processor core may be configured to provide test patterns or used for comparison of the test pattern outputs.

7 Claims, 9 Drawing Sheets

OTHER PUBLICATIONS

"Motorola Technical Developments," Magazine of Motorola, Inc., vol. 39, Sep. 1999. pp. i-vii and 77-80.

"Triscend E5 Configurable System-on-Chip Family," Product Description from Triscend Corporation, Jan. 2000 (Version 1.00), pp. i-ii and 1-90.

"Wireless Base Station Design Using Reconfigurable Communications Processors," Wireless Base Station White paper from ChameleonSystems, Inc., 2000, pp. 1-8.

Altera "APEX 20K Programmable Logic Device Family Data Sheet," May 1999.

Altera "FLEX 10K Embedded Programmable Logic Family Data Sheet," May 1999.

Altera "FLEX 8000 Programmable Logic Device Family Data Sheet," May 1999.

Altera "IEEE 1149.1 (JTAG) Boundary-Scan Testing in Altera Devices," Aug. 1999, Application Note 39.

Altera "MAX 7000 Programmable Logic Device Family Data Sheet," May 1999.

Aitken, R.C., and Agarwal, V.K., "A Diagnosis Method Using Pseudo-Random Vectors Without Intermediate Signatures," Proc. of Int. Conf. on Computer-Aided Design (ICCAD), IEEE pp. 574-577 (1989).

Mc Anney, M.G. and Savir, J., "The is Information in Faulty Signatures," Proc. of International Test Conf., IEEE, pp. 630-636 (1987).

Ghosh-Dastidar, J., Das, D., and Touba, N.A., "Fault Diagnosis in Scan-Based BIST using Both Time and Space Information," Proc. of International Test. Conf., IEEE, pp. 95-102 (1999).

Ghosh-Dastidar, J., and Touba, N.A., "A Rapid and Scalable Diagnosis Scheme for BIST Environments With a Large Number of Scan Chains," Proc. of IEEE VLSI Test Symposium, pp. 79-85 (2000).

* cited by examiner

METHOD AND APPARATUS FOR TESTING INTEGRATED CIRCUITS

CROSS-REFERENCES TO RELATED APPLICATIONS

This application is related to the following commonly-owned U.S. patent applications: application Ser. No. 09/688,665, filed Sep. 22, 2000, entitled "Bus Architecture for System on a Chip," application Ser. No. 09/668,704, filed Sep. 22, 2000, entitled "Setting Up Memory and Registers from a Serial Device," application Ser. No. 09/668,202, filed Sep. 22, 2000, entitled "Re-configurable Memory Map for a System on a Chip," application Ser. No. 09/881,226, filed Jul. 12, 2001, entitled "Embedded Processor with Dual-Port SRAM for Programmable Logic," application Ser. No. 09/880,458, filed Jul. 12, 2001, entitled "I/O Circuitry Shared between Processor and Programmable Logic Portions of an Integrated Circuit," application Ser. No. 09/880,734, filed Jul. 12, 2001, entitled "Embedded Processor with Watchdog Timer for Programmable Logic," and application Ser. No. 09/880,749, filed Jul. 12, 2001, entitled "JTAG Mirroring Circuitry and Methods," which are all hereby incorporated herein by reference.

BACKGROUND

The present invention relates in general to integrated circuits and in particular to a method and apparatus for testing of integrated circuits.

Integrated circuits are important building blocks of almost all of today's electronic devices. Technology continues to evolve and integrated circuits continue to provide improved functionality. As integrated circuits improve, so do the electronics systems that are built using integrated circuits. There are many types of integrated circuits such as memories, microprocessors, application specific integrated circuits (ASICs), and programmable logic. Programmable logic integrated circuits such as PALs, PLDs, FPGAs, LCAs, and others are becoming more complex and continually evolving to provide more user-programmable features on a single integrated circuit. Modern programmable logic integrated circuits incorporate programmable logic including both combinational and sequential logic. Such logic may include logic gates, products terms, look-up tables, or registers to name just a few. Programmable logic integrated circuits also include embedded user-programmable memory.

Generally, there is a continuing desire to provide both greater functionality and greater performance in programmable logic, as well as in other types of integrated circuits. However, increased levels of integration also result in an integrated circuit's increased susceptibility to defects. Accordingly, improved techniques for testing integrated circuits have been an area of continuously increasing interest. For example, FIG. 1 shows an integrated circuit 100 illustrating a known technique for testing combinational and sequential logic. Integrated circuit 100 includes a combinational and sequential logic block 101 and a built-in self test unit 102. Built-in self test unit 102 is designed to generate test vectors as inputs to logic 101. Logic 101 generates responses to the test vectors that are transmitted back to built-in self test unit 102 for analysis. Based on the responses received from logic 101, built-in self test unit can identify the existence of logic errors that may be caused by defects in the integrated circuit. Individual integrated circuits may then be tested during manufacturing, and devices containing defects can be separated from non-defective devices so that defective products are not sold to customers.

FIG. 2 shows one known circuit for implementing a built-in self testing technique. Built-in self test circuit 200 includes a test pattern generator 201 ("TPG"), logic and register chains 202, and a multiple input signature register 203 ("MISR"). Test vectors are then generated by TPG 201 and applied to the logic to produce output patterns. These output patterns are then received by the MISR 203 and encoded to generate a digital code sometimes referred to as a "signature." The signature is compared to a "golden signature," which is developed in advance, and corresponds to a signature that should be generated by the logic when there are no defects. The signature produced by the logic during test is compared to the "golden signature" to determine whether or not the logic under test contains defects. The problem with the use of "golden signatures," however, is that the output responses become so highly encoded that it becomes almost impossible to extract information about the cause of the error. In particular, it is impossible to determine either the particular logic elements that contain the fault or the test vector that generated the fault.

Therefore, there is a need for an improved method and apparatus for testing of integrated circuits.

SUMMARY

Embodiments of the present invention provide a method and apparatus for testing an integrated circuit. The present invention may be part of a built-in self test circuit residing on the same integrated circuit as the integrated circuit's logic units. One particular type of integrated circuit that may benefit from embodiments of the present invention is a programmable logic integrated circuit.

In one embodiment, the present invention includes an integrated circuit comprising three or more logic units. Each logic unit receives a test pattern and generates a test result in response to the test pattern. A comparator is coupled to receive the outputs of the three or more logic units. The comparator generates an error signal when a test result of one of the logic units is different from at least two other test results.

In another embodiment, the present invention includes an integrated circuit comprising configurable logic having an operational configuration and a test configuration. The test configuration comprises three or more scan chains. Each scan chain receives a test pattern, and in accordance therewith, generates three or more scan chain outputs. A comparator is coupled to receive the three or more scan chain outputs and generate an error signal when a first scan chain output is different from at least two other scan chain outputs.

In yet another embodiment, the present invention includes programmable logic and an embedded processor core. The programmable logic includes a plurality of logic units, and the embedded processor core provides a test pattern to each of the plurality of logic units to produce a plurality of logic unit outputs. The embedded processor core generates an error signal when one of the plurality of logic units includes at least one defect.

Embodiments of the present invention may be utilized in programmable logic integrated circuits. Additionally, embodiments of the present invention may include a microprocessor for providing a test pattern. The microprocessor may also receive outputs generated in response to the test patterns and generate an error signal when a one of the outputs is different from the other outputs.

In one embodiment, the present invention provides a method of testing an integrated circuit. The method comprises configuring the integrated circuit into three or more logic units, providing a test pattern to each logic unit to produce three or more outputs, comparing each logic unit output to the other logic unit outputs, and generating an error signal when a first logic unit output is different from at least two other logic unit outputs.

The following detailed description and accompanying drawings provide a better understanding of the nature and advantages of the present invention.

DETAILED DESCRIPTION

Figure 1:
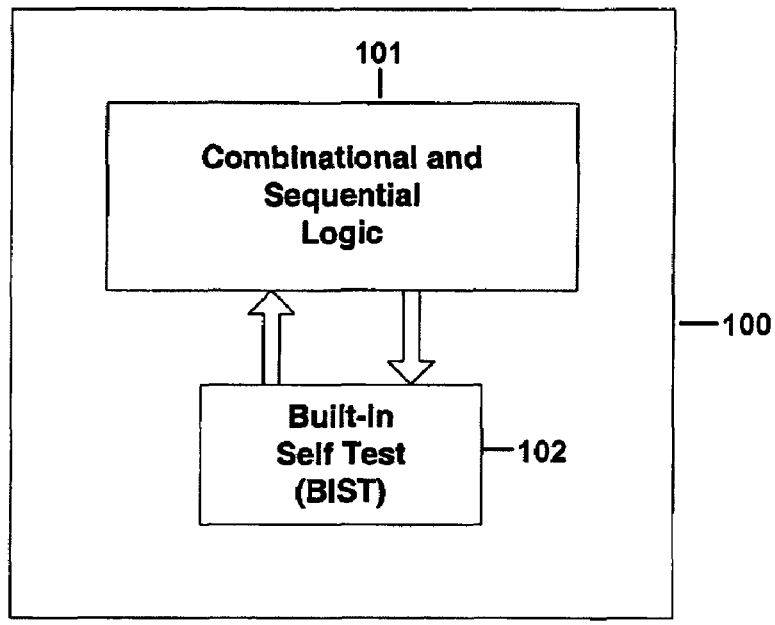
FIG. 1 illustrates an integrated circuit including a prior art technique for testing combinational and sequential logic.
Figure 2:
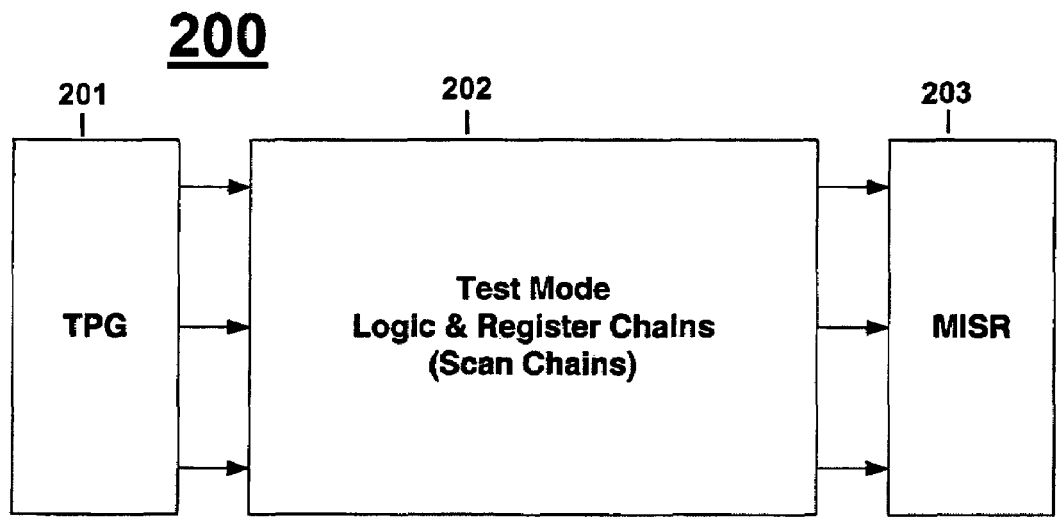
FIG. 2 shows one known circuit for implementing built-in self testing.
Figure 3:
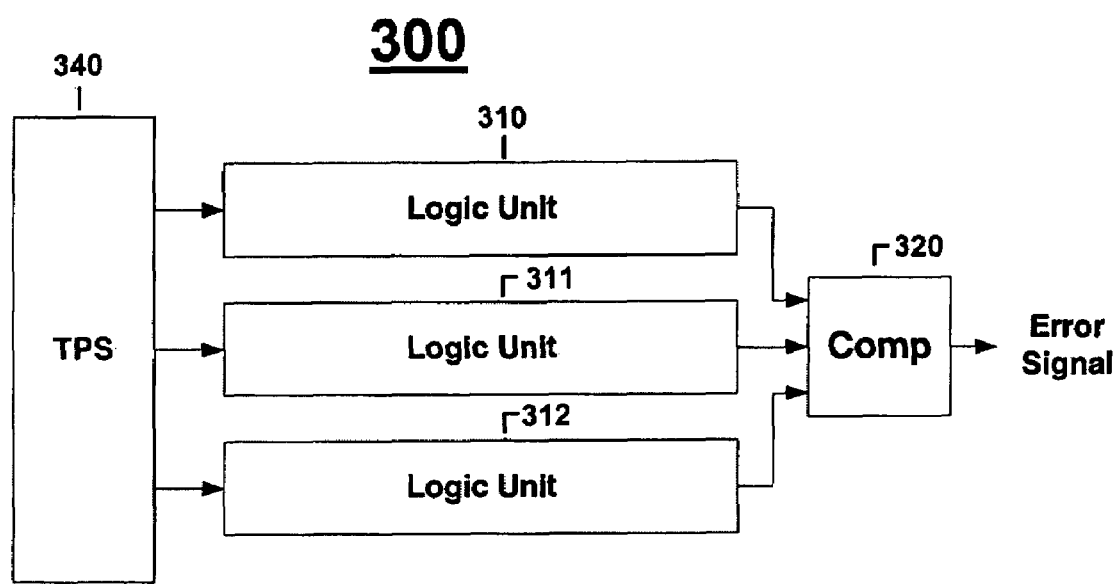
FIG. 3 is a simplified block diagram of an integrated circuit including a test circuit according to one embodiment of the present invention.

FIG. 3 is a simplified block diagram of an integrated circuit 300 including a test circuit according to one embodiment of the present invention. Integrated circuit 300 includes three or more logic units 310-312 each having an input for receiving a test pattern from a test pattern source 340 ("TPS"). Each logic unit generates test results in response to the test pattern. The test results are received by a comparator 320, which compares the received results and generates an error signal when one of the test results is different from at least two of the other test results. Comparator 320 may be implemented in either hardware or software as is well know to those skilled in the art. Additionally, it is to be understood that the test patterns may be received in, or transmitted from, the logic units using either serial or parallel connections.

In one embodiment of the present invention, the integrated circuit is a programmable logic integrated circuit. Programmable logic devices are sometimes referred to as a PALs, PLAs, FPLAs, PLDs, CPLDs, EPLDs, EEPLDs, LCAs, or FPGAs and are well-known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated by reference for all purposes. Programmable logic devices are currently represented by, for example, Altera's MAX®, FLEX®, and APEX™ series of PLDs. These are described in, for example, U.S. Pat. Nos. 4,871,930, 5,241,224, 5,258,668, 5,260,610, 5,260,611, 5,436,575, and the Altera Data Book (1999), all incorporated by reference in their entirety for all purposes.

Figure 4:
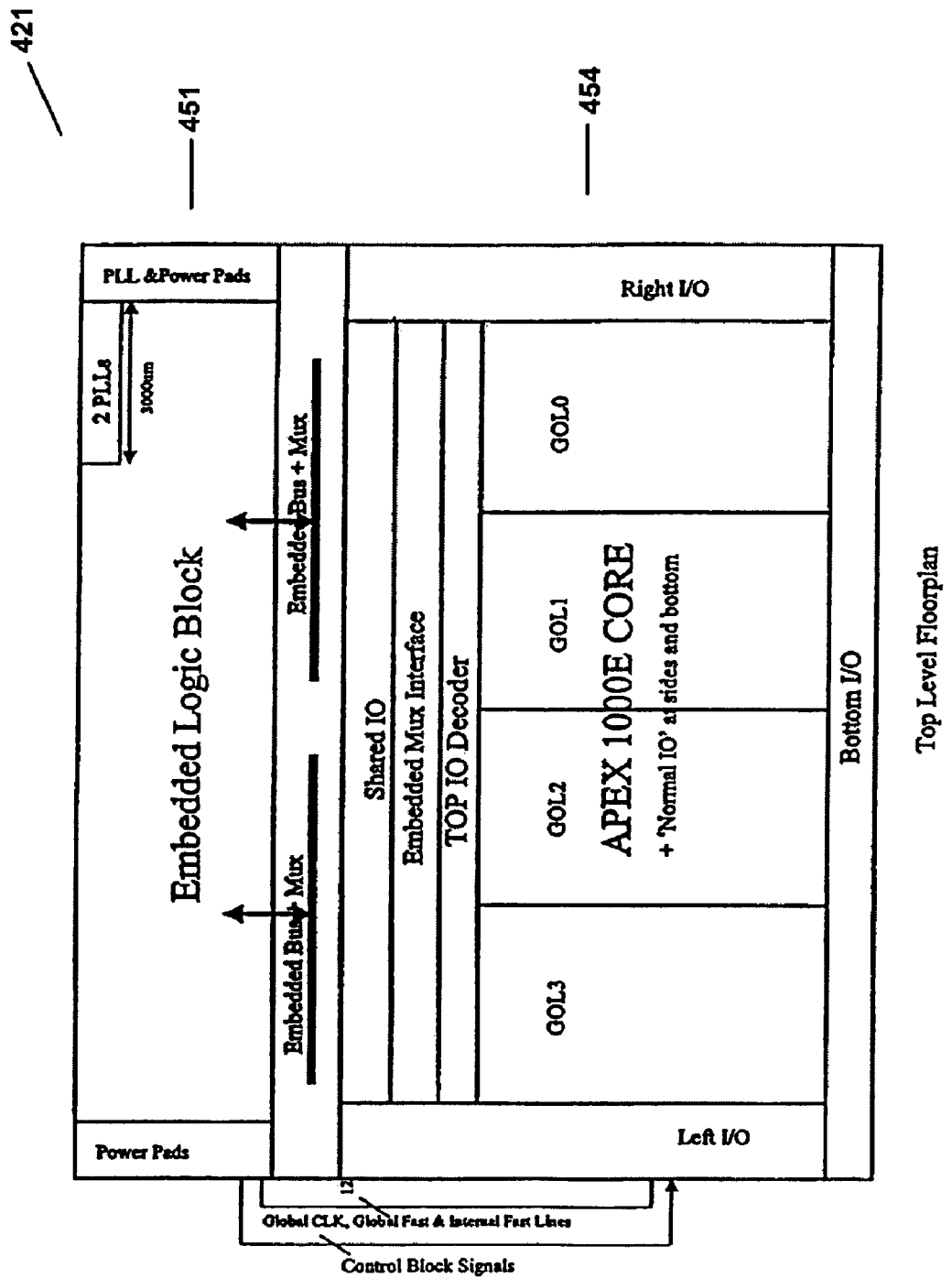
FIG. 4 is a diagram showing a floor plan of an exemplary programmable logic integrated circuit with an embedded processor.

Embodiments of the present invention may include a microprocessor for generating the test patterns. In one embodiment a microprocessor is coupled to programmable logic for testing the programmable logic structures. An embedded processor may be used for providing inputs to, and/or receiving the outputs from, the logic blocks and analyzing the test results. In one embodiment, an embedded processor also performs a comparison operation of three or more logic unit outputs. FIG. 4 is a diagram showing a floorplan architecture or layout of an exemplary programmable logic integrated circuit with an embedded processor. In an aspect of the invention, an integrated circuit includes on the same semiconductor substrate, programmable logic and an embedded processor core. The integrated circuit provides a system on a programmable chip (SOPC) architecture. The PLD integrated circuit 421 includes an embedded logic block portion 451 and programmable logic potion 454. The embedded logic block 451 is the portion of the integrated circuit containing an on-chip or embedded processor core. This embedded processor portion may also be referred to as a "stripe" because in the exemplary embodiment shown it occupies a stripe along an entire edge of the layout of the chip; this stripe is adjacent to the programmable logic portion 451. In the embodiment of FIG. 4, the stripe is located along one edge of the integrated circuit. In other embodiments, the embedded processor portion may be organized in a shape other than a stripe, and may not run the entire length of the integrated circuit. Further, the embedded processor portion may not be positioned along an edge of the integrated circuit, but may be within or internal to the integrated circuit. For example, in a specific embodiment, the processor portion may be totally enclosed within the programmable logic portion.

In brief, the embedded processor core portion of the integrated circuit may include an on-chip RAM section, a CPU (central processing unit) section, cache section (for the CPU), external bus interface section, and a universal asynchronous receiver-transistor (UART) section. The CPU section may include a JTAG/debug external interface. The external bus interface can interface to external devices. The UART can interface with a serial port and facilitate asynchronous serial communication. In other embodiments of the invention, the integrated circuit may also support universal serial bus (USB) communication or IEEE 1394 communication (also known as FireWire), or both. In a specific embodiment, the CPU is an ARMS core such as an ARM922T™ 32-bit RISC processor core (ARM® is registered trademark of ARM Inc., and ARM922T™ is a trademark of ARM Inc.). In other embodiments, the CPU may be a MIPS® core such as the MIPS32™ 4Kc™ 32-bit RISC processor core (MIPS® is a registered trademark of MIPS Technologies Inc., and MIPS32T™ 4KC m are trademarks of MIPS Technologies, Inc.). The embedded processor core portion is positioned above the top I/Os of the programmable logic portion. The programmable logic portion has I/Os in a ring around it, including right and left I/Os and bottom I/O. The top I/Os are referred to as shared I/Os because these are I/Os that are shared by both the processor and programmable logic of the integrated circuit. In other words, either the processor or programmable logic portions may input data or output data, or both, using the shared I/Os.

Figure 5:
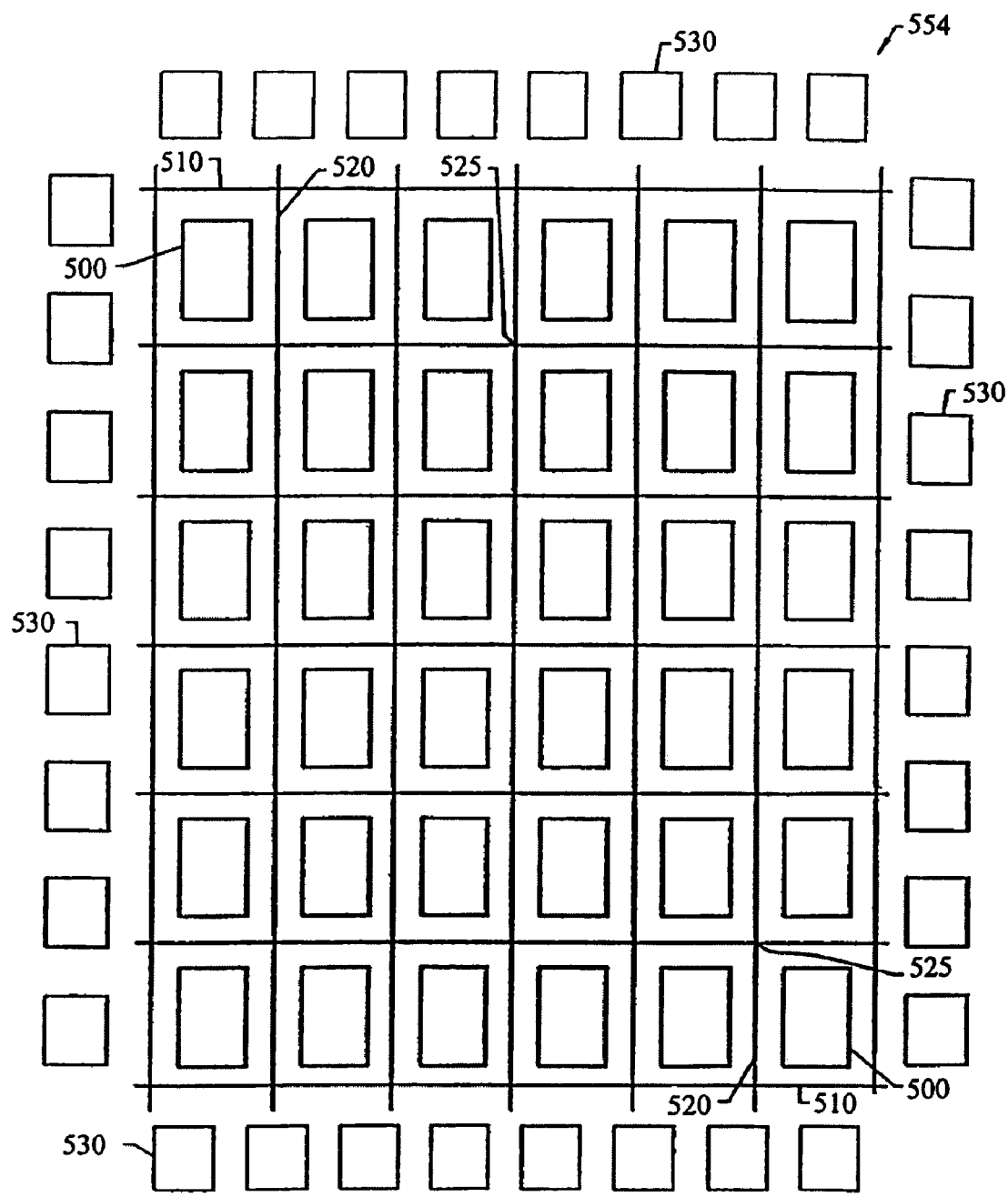
FIG. 5 is a diagram showing the programmable logic portion of the programmable logic integrated circuit of FIG. 4.

FIG. 5 is an exemplary and simplified block diagram of an overall internal architecture and organization of PLD portion 554. Many details of programmable logic architecture, organization, and circuit design are not necessary for an understanding of the present invention and such details are not shown in FIG. 5. Embodiments of the present invention take advantage of the symmetrical nature of programmable logic by providing test patterns to three or more logic units that are uniform across the integrated circuit. Because programmable logic includes numerous substantially identical logic units, each unit should produce the same output in response to an input test pattern. Therefore, three or more outputs received from the logic units may be compared against one another. If one of the logic units produces an output different from the other outputs, such logic unit can be identified as having a defect, and an error signal can be generated. Logic units on a programmable logic integrated circuit may include the logic blocks, or conceivably, the logic elements discussed below. However, it is to be understood that the present invention is not limited by any particular type of logic unit described herein.

FIG. 5 shows a six-by-six two-dimensional array of thirty-six logic array blocks (LABs) 500. LAB 500 is a physically grouped set of logical resources that is configured or programmed to perform logical functions. The internal architecture of a LAB will be described in more detail below in connection with FIG. 6. The programmable logic portion may contain any arbitrary number of LABs, more or less than shown in PLD portion 554 of FIG. 5. Generally, in the future, as technology advances and improves, programmable logic devices with greater numbers of logic array blocks will undoubtedly be manufactured. Furthermore, LABs 500 need not be organized in a square matrix or array; for example, the array may be organized in a five-by-seven or a twenty-by-seventy matrix of LABs.

LAB 500 has inputs and outputs (not shown) which may or may not be programmably connected to a global interconnect structure, comprising an array of global horizontal interconnects (GHs) 510 and global vertical interconnects (GVs) 520. Although shown as single lines in FIG. 5, each GH 510 and GV 520 line may represent a plurality of signal conductors. The inputs and outputs of LAB 500 may be programmably connectable to an adjacent GH 510 and an adjacent GV 520 at intersections 525. Utilizing GH 510 and GV 520 interconnects, multiple LABs 500 may be connected and combined to implement larger, more complex logic functions than can be realized using a single LAB 500.

The programmable logic architecture in FIG. 5 further shows at the peripheries of the chip, input-output drivers 530. Input-output drivers 530 are for interfacing the PLD to external, off-chip circuitry. FIG. 5 shows thirty-two input-output drivers 530; however, a programmable logic integrated circuit may contain any number of input-output drivers, more or less than the number depicted. Some of these input-output drivers may be shared between the embedded processor and programmable logic portions. Each input-output driver 530 is configurable for use as an input driver, output driver, or bidirectional driver. In other embodiments of a programmable logic integrated circuit, the input-output drivers may be embedded with the integrated circuit core itself. This embedded placement of the input-output drivers may be used with flip chip packaging and will minimize the parasitics of routing the signals to input-output drivers.

Figure 6:
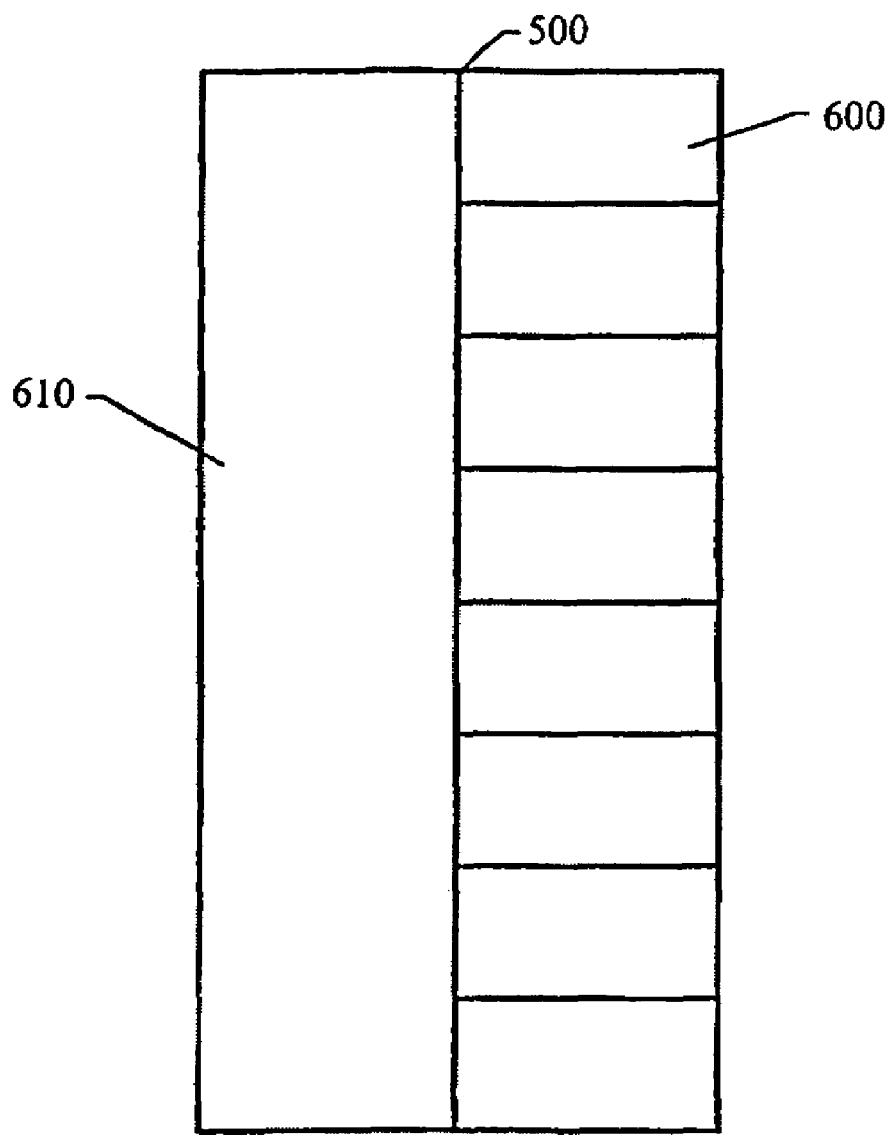
FIG. 6 is a simplified block diagram of a logic array block (LAB).

FIG. 6 shows a simplified block diagram of LAB 500 of FIG. 5. LAB 500 is comprised of a varying number of logic elements (LEs) 600, sometimes referred to as "logic cells," and a local (or internal) interconnect structure 610. LAB 500 has eight LEs 600, but LAB 500 may have any number of LEs, more or less than eight.

A general overview of LE 600 is presented here, sufficient to provide a basic understanding one embodiment of the present invention. LE 600 is the smallest logical building block of a PLD. Signals external to the LAB, such as from GHs and GVs, are programmably connected to LE 600 through local interconnect structure 610. In one embodiment, LE 600 of the present invention incorporates a function generator that is configurable to provide a logical function of a number of variables, such a four-variable Boolean operation. As well as combinatorial functions, LE 600 also provides support for sequential and registered functions using, for example, flip-flops.

LE 600 provides combinatorial and registered outputs that are connectable to the GHs and GVs outside LAB 500. Furthermore, the outputs from LE 600 may be internally fed back into local interconnect structure 610 through local interconnect structure 610. An output from one LE 600 may be programmably connected to the inputs of other LEs 600 without using the global interconnect structure's GHs and GVs. Local interconnect structure 610 allows short-distance interconnection of LEs, without utilizing the limited global resources.

Figure 7:
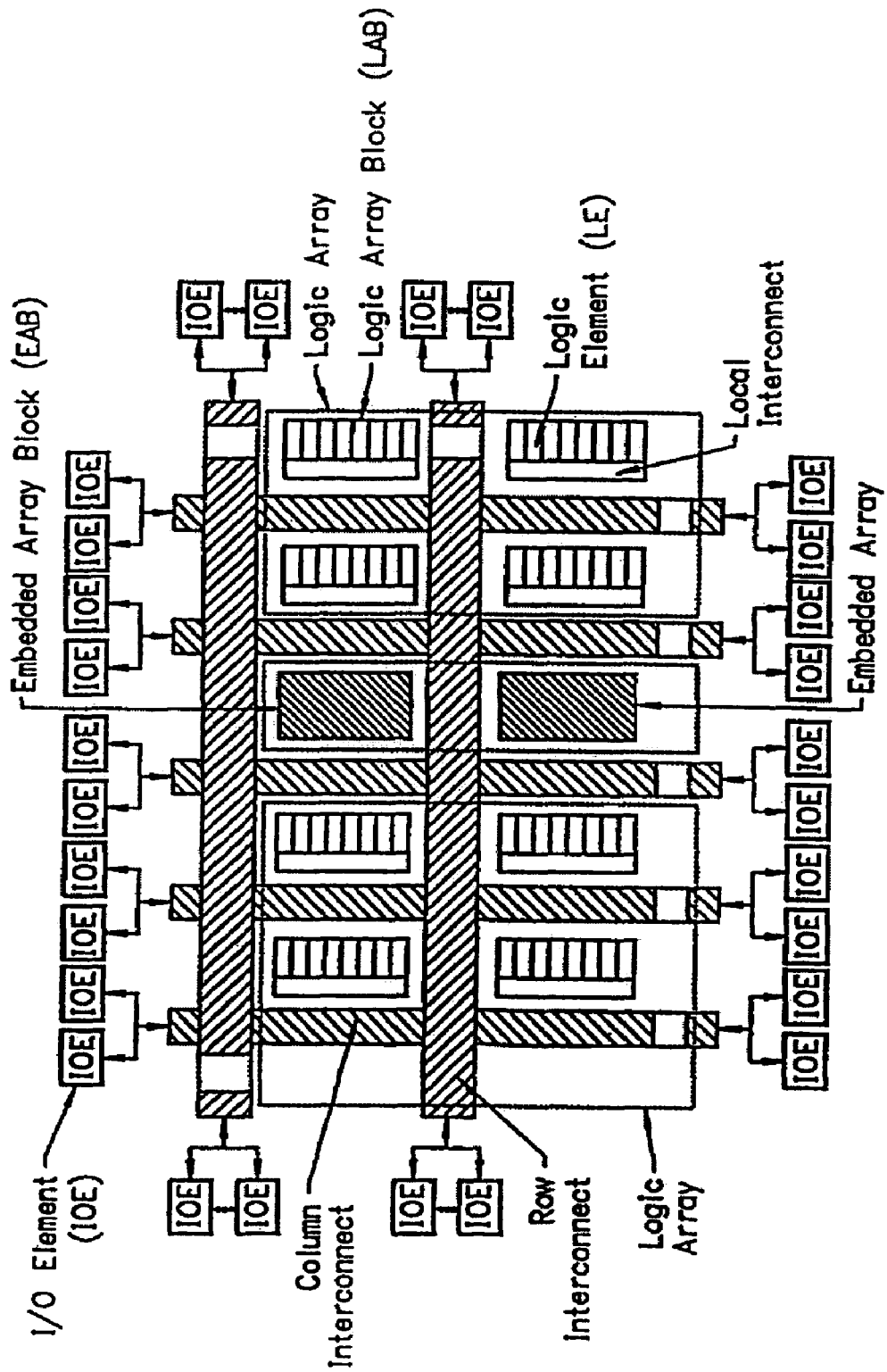
FIG. 7 shows an architecture of an exemplary programmable logic integrated circuit with embedded array blocks (EABs).

FIG. 7 shows a programmable logic architecture similar to that in FIG. 5. The architecture in FIG. 7 further includes embedded array blocks (EABs). EABs may contain user memory such as a flexible block of RAM. More discussion of this architecture may be found in the *Altera Data Book* (1999) in the description of the FLEX® 10K product family and also in U.S. Pat. No. 5,550,782, which are incorporated by reference.

Figure 8:
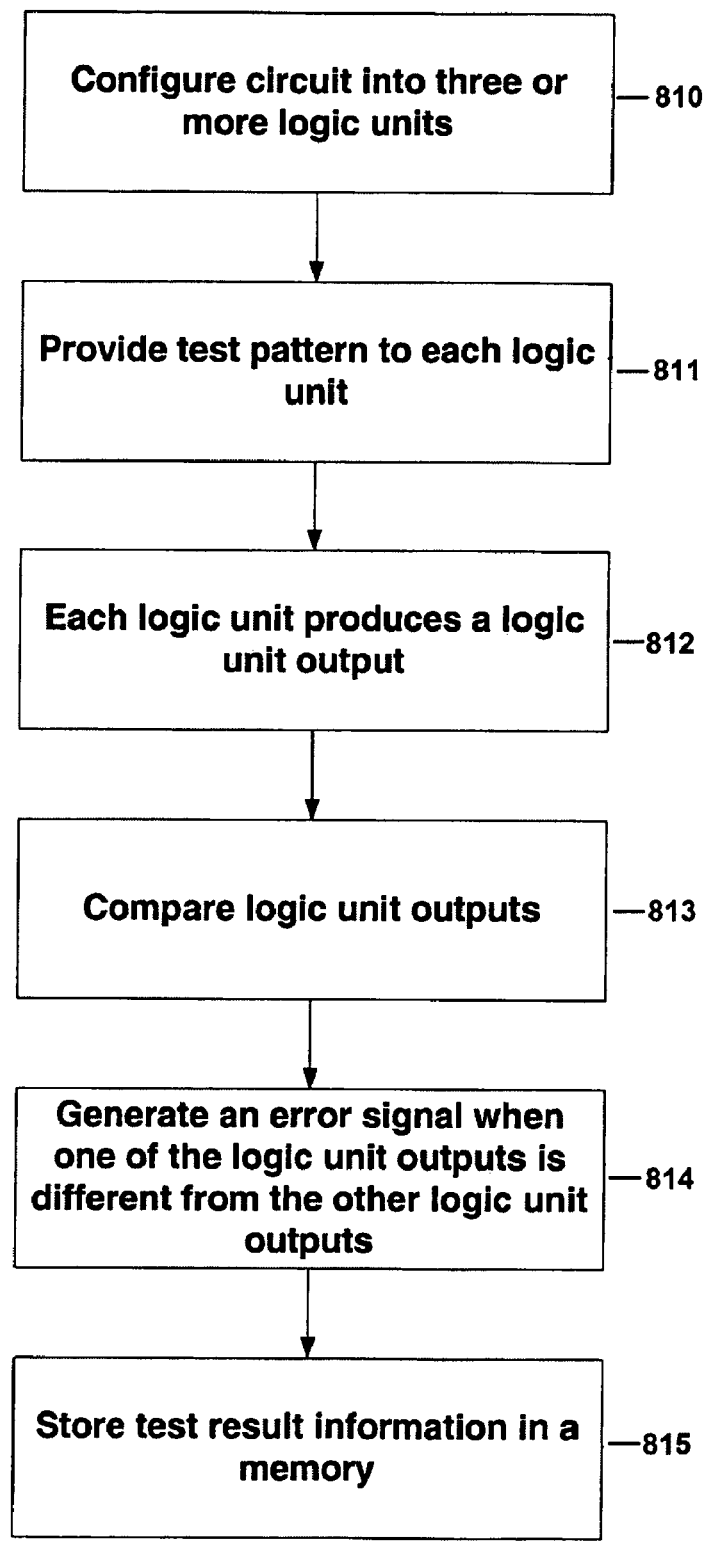
FIG. 8 is a flow chart illustrating a method of testing an integrated circuit according to one embodiment of the present invention.

FIG. 8 is a flow chart illustrating a method of testing an integrated circuit according to one embodiment of the present invention. The method illustrated by the flow chart of FIG. 8 may be particularly advantageous for testing programmable logic integrated circuits, but it is also advantageous for testing other integrated circuits that include three or more logic units that receive test patterns and produce the same test results when operating properly (i.e., when there are no defects). At step 810, an integrated circuit is configured into three or more logic units. The circuit may be configured in accordance with programmable logic techniques, through the use of scan chains (discussed below), or through equivalent techniques. At step 811, a test pattern is provided to each logic unit. In one embodiment, a test pattern may include a plurality of test vectors. For example, a test pattern may be an N×M array comprising N test vectors that each M input bits. Upon receiving the test patterns, each logic unit produces an output (e.g., a test result). In one highly advantageous embodiment, the logic units are structurally and/or functionally the same (i.e., the produce the same output for a given input). Accordingly, each logic unit may receive the same test pattern and, absent a defect in one of the logic units, they will produce the same outputs. On the other hand, it is conceivable that logic units having different structures and/or functions could utilize embodiments of the present invention. Different test patterns could be developed for each logic unit so that the outputs of each logic unit are the same.

In one embodiment, the outputs will be a stream of logic values, each output corresponding to a particular test vector input. At step 813, each output is compared against the other outputs. When one of the logic units generates an output different than the other logic unit outputs, that logic unit is deemed to include at least one defect. At step 814, an error signal may be generated when one of the logic unit outputs is different from the other logic unit outputs. At step 815, test result information may be stored in a memory. For example, if an error signal is generated, the system may store an indication of which test vector input caused the error signal.

Alternatively, the system may store an indication of which logic unit caused the error signal (i.e., which logic unit produced an output different from the other logic unit outputs). On the other hand, the system may store an indication of the erroneous logic value received from the logic unit that caused the error signal. Some or all of the above test result information may be stored in a memory and accessed by a user to learn more about the cause of the error.

Figure 9:
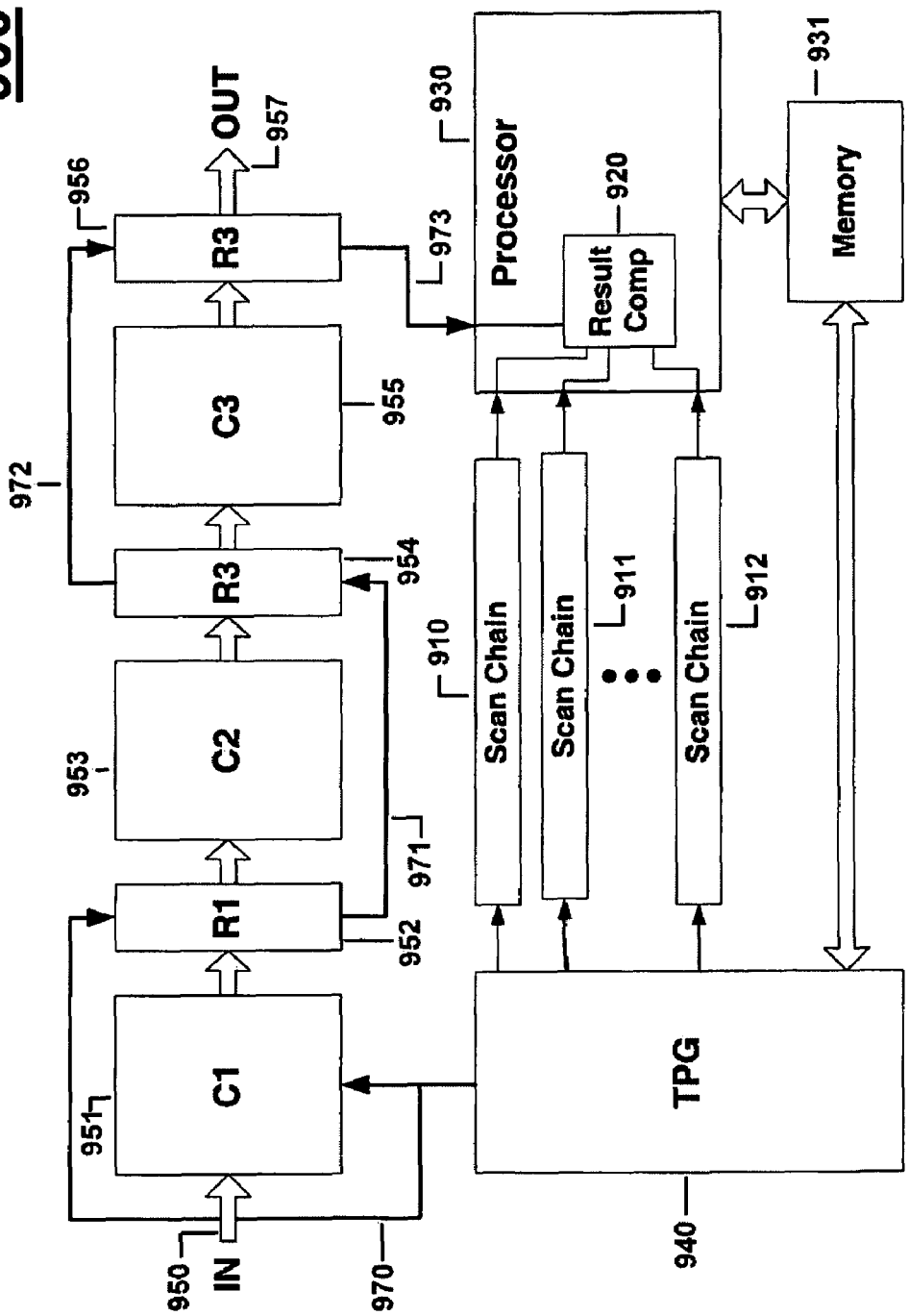
FIG. 9 illustrates an integrated circuit that may be configured into three or more scan chains for testing according to one embodiment of the present invention.

FIG. 9 illustrates an integrated circuit 900 including logic that may be configured into three or more scan chains for testing according to one embodiment of the present invention. A first logic unit may include combinational logic 951, 953, and 955 and sequential logic 952, 954, and 956. Integrated circuit logic may be configured into an operational configuration and a test configuration. In the operational configuration, integrated circuit 900 performs some designed function or set of functions. In the test configuration, the logic may be configured into three or more scan chains. A first scan chain is configured to test combinational logic 951, 953, and 955 and sequential logic 952, 954, and 956. The particular combinational and sequential logic in FIG. 9 are shown to illustrate the concept of a scan chain. Typically, digital systems will include a variety of both combinational logic (e.g., various logic gates) and sequential logic (e.g., flip-flops, registers, latches) that are connected in a particular way to implement specific functions or programmable functions. When an integrated circuit enters a test mode, the registers may be reconfigured so that they are connected in series. In a series configuration, the registers may be programmed with predetermined values to facilitate testing of both the registers themselves, as well as the combinational logic connected to each register's inputs and outputs.

Integrated circuit 900 shows a simplified example of a scan chain for illustrative purposes only. It is to be understood that integrated circuits, such as programmable logic and others, may also be configured into a variety of different scan chains other than the particular one shown in FIG. 9 and still benefit from embodiments of the present invention. In an operational mode, integrated circuit 900 may receive inputs values on input lines 950. The inputs may be provided to combinational logic 951. The outputs of combinational logic 951 are received by registers 952. The outputs of registers 952 are received at the input of combinational logic 953. The outputs of combinational logic 953 are received by more registers 954. Similarly, the outputs of registers 954 are provided to the inputs of combinational logic 955, and the outputs of combinational logic 955 are received by registers 956. The outputs of registers 956 may be the outputs of a particular logic unit.

When the integrated circuit is in a test configuration, registers 952, 954, and 956 may be serially connected between a test pattern generator 940 and a processor 930 on lines 970, 971, 972, and 973. Test pattern generator 940 may apply test vectors to the inputs of both the combinational logic 951 and serially connected registers 952, 954, and 956. The inputs to the combinational logic 951 may be received by registers 952 and shifted out to processor 930. Additionally, registers 952 and 953 may be programmed with predetermined values that are provided as inputs to combinational logic 953 and 955. The results are received by registers 954 and 956, and may be shifted out to processor 930.

Using the same or similar approach, other logic units in integrated circuit 900 may be configured into scan chains 910, 911, and 912. The outputs of each scan chain are provided to a result comparator 920 included in each processor 930. When the combinational or sequential logic in the scan chains is free of faults, the scan chains will produce the same outputs in response to receiving test patterns. However, when one of the scan chains includes at least one defect, that scan chain will produce an output different from the other scan chain outputs. The comparator receives the scan chain outputs and compares each of the scan chain outputs against the other scan chain outputs. When one of the outputs is different, the comparator generates an error signal.

In one embodiment, integrated circuit 900 includes a memory 931 for storing test result information. Test result information stored in the memory may include a variety of information including indications about the cause of the error signal. For example, test information may indicate the erroneous logic value or values received from the defective scan chain, the test vector input that produced the erroneous output, or the particular scan chain or scan chain position that includes the defect. Some or all of this information may then be used to determine the cause of the problem.

Figure 10:
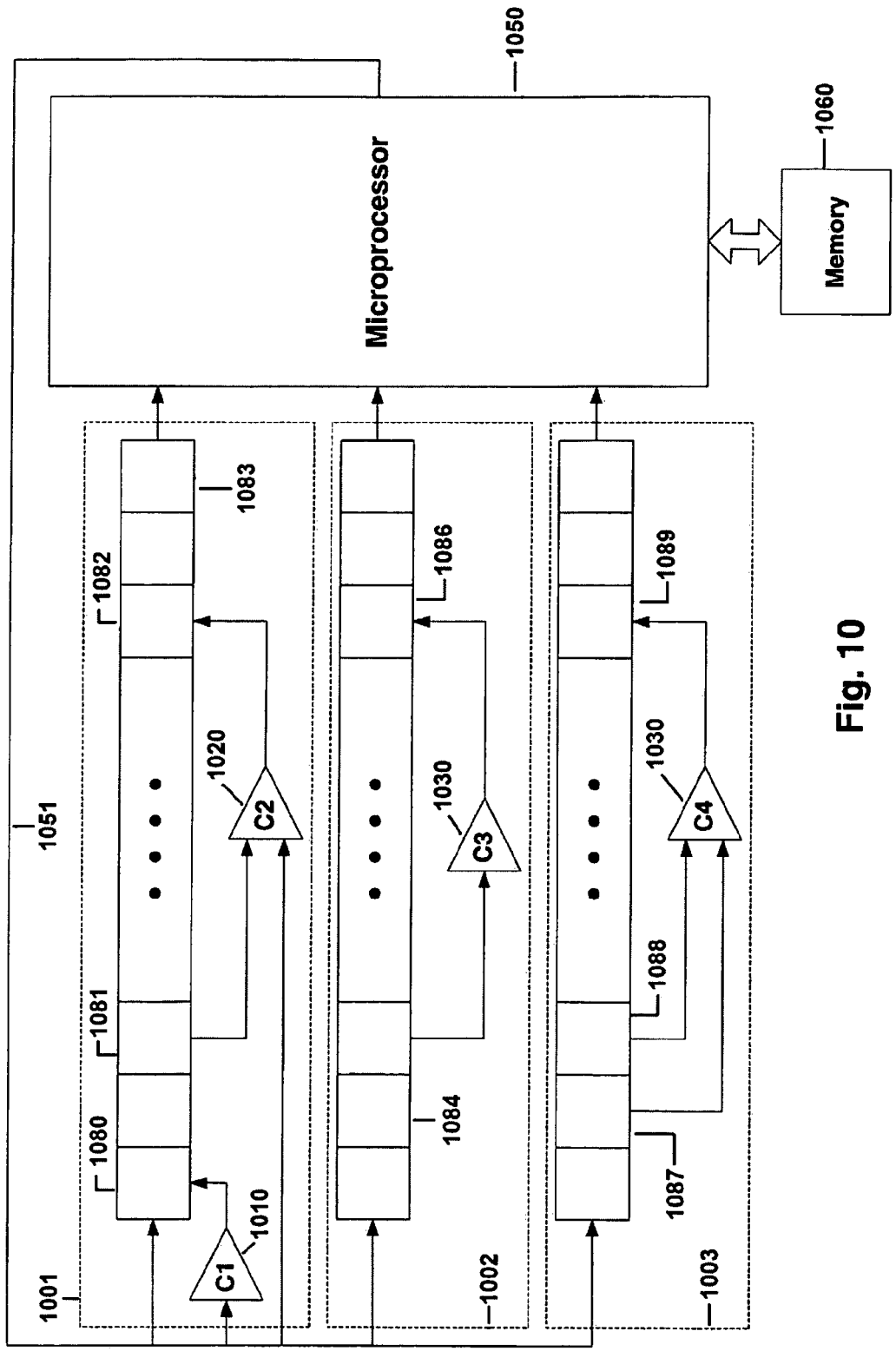
FIG. 10 is a simplified diagram showing an integrated circuit including scan chain configured logic and a microprocessor according to one embodiment of the present invention.

FIG. 10 is a simplified diagram showing an integrated circuit 1000 including scan chain configured logic and a microprocessor according to one embodiment of the present invention. Some integrated circuits, such as the programmable logic discussed above, may include large amounts of combinational and sequential logic on the same integrated circuit as a processor. Microprocessor 1050 may be used to produce test patterns for scan chains 1001, 1002, and 1003. The scan chain outputs produced in response to the test patterns (i.e., the test results) may also be received and compared against each other by microprocessor 1050 to produce an error signal when one of the test results is different from the other test results. Integrated circuit 1000 may also include a memory 1060 for storing test result information as described with regard to FIG. 9.

Scan chains 1001-1003 each include inputs coupled to the output of microprocessor 1050. Scan chain 1001 includes series connected registers including registers 1080-1083 (e.g., flip-flops) and combinational logic 1010 ("C1") and 1020 ("C2"). Additionally, scan chain 1002 includes series connected registers including registers 1084-1086 and combinational logic 1030 ("C3"). Moreover, scan chain 1003 includes series connected registers including registers 1087-1089 and combinational logic 1040 ("C4"). Combinational logic 1010, 1020, 1030, and 1040 are depicted to further illustrate the concept of a scan chain. While each scan chain is depicted in FIG. 10 as having different combinational logic, it is to be understood that embodiments of the present invention may typically, but not necessarily always, be configured into scan chains that are structurally identical so that the outputs are the same when the same test patterns are received as inputs. Therefore, the different combinational logic configurations shown in each scan chain in FIG. 10 will typically also exist in each of the other scan chains. Moreover, embodiments of the present invention will typically include many more such combinational logic blocks than that four illustrated here. Accordingly, the combinational logic of FIG. 10 is merely illustrative of a few of the possible configurations that may benefit from the present invention.

Microprocessor 1050 provides test patterns to series connected registers in each scan chain. For instance, registers 1080 receive test patterns on signal lines 1051 for testing both the sequential and combinational logic in scan chain 1001. combinational logic 1010 illustrates a combinational logic configuration that receives input patterns directly from microprocessor 1050 and produces outputs that are captured on the series connected registers in the scan chain. For example, the output of combination logic 1010 may be captured by registers 1080. Combinational logic 1020 illustrates a configuration that receives input patterns directly on lines 1051 as well as from the outputs of internal registers 1081 to generate an output to internal registers 1082. Logic values captured by the scan chain may be shifted as needed for different circuit designs to implement full testing of the logic units. Additionally, each of the other scan chains may include similar structures that receive the same input pattern and generate the same outputs when no defects are present.

Combinational logic 1030 illustrates a configuration that receives inputs and generates outputs between internal series connected registers 1085 and 1086. The output of registers 1086 may be shifted out for comparison against the outputs similar structures that may exist in each of the other scan chains. Combinational logic 1040 illustrates a configuration that receives inputs from two internal registers 1087 and 1088. The output of logic 1040 is received by registers 1089, and may be shifted to the microprocessor for comparison against the test results of similar structures that may exist in each of the other scan chains.

Embodiments of the present invention have been explained with reference to particular examples and figures. Other embodiments will be apparent to those of ordinary skill in the art. Therefore, it is not intended that this invention be limited except as indicated by the claims.

What is claimed is:

1. An integrated circuit comprising:
    a plurality of programmable logic units arranged in a plurality of rows and columns and configurable to implement user-define logic functions, each row having an input for receiving a test pattern and an output for providing a test result in response to the test pattern, wherein at least one row comprises a first register having an output coupled to an input of a first combinatorial logic block, and a second register having a first input coupled to an output of the first register and a second input coupled to an output of the first combinatorial logic block; and
    a comparator coupled to receive test results for at least three rows including a first row and a second row, each test result comprising a stream of logic values, and then generate an error signal when a first test result provided by the first row is different from a second test result provided by the second row.

2. The integrated circuit of claim 1 wherein each row of programmable logic units produces the same test result when there are no defects in any of the programmable logic units, and a first row of programmable logic units produces a different test result from the other programmable logic units when the first row of programmable logic units includes at least one defect.

3. The integrated circuit of claim 1 wherein each row of programmable logic units is configured into a scan chain.

4. The integrated circuit of claim 1 wherein the test pattern comprises a plurality of test vectors to generate the programmable logic unit test results.

5. The integrated circuit of claim 4 further comprising a memory for storing test result information, wherein when an error signal occurs, the test information includes an indication of which programmable logic unit caused the error signal.

6. The integrated circuit of claim 1 further comprising a microprocessor coupled to and input of each row of programmable logic units to provide the test pattern.

7. The integrated circuit of claim 6 wherein the comparator is included in the microprocessor.

\* \* \* \* \*